United States Patent
Lu et al.

(10) Patent No.: US 10,474,206 B1
(45) Date of Patent: Nov. 12, 2019

(54) RETAINING TRAY FOR RETAINING AN M.2 COMPATIBLE DEVICE USED IN AUTONOMOUS DRIVING VEHICLES

(71) Applicant: Baidu USA LLC, Sunnyvale, CA (US)

(72) Inventors: Weiyu Lu, Sunnyvale, CA (US); Ji Li, Sunnyvale, CA (US); Fu-kang Liao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 16/102,661

(22) Filed: Aug. 13, 2018

(51) Int. Cl.
| H05K 5/00 | (2006.01) |
| G06F 1/18 | (2006.01) |
| H01R 13/50 | (2006.01) |
| H01R 12/71 | (2011.01) |

(52) U.S. Cl.
CPC ............. *G06F 1/185* (2013.01); *H01R 12/71* (2013.01); *H01R 13/50* (2013.01); *H05K 5/00* (2013.01)

(58) Field of Classification Search
None
See application file for complete search history.

(56) References Cited

U.S. PATENT DOCUMENTS

| 5,563,770 | A | * | 10/1996 | Bethurum | G06K 19/077 257/679 |
| 5,590,023 | A | * | 12/1996 | Hernandez | G06F 1/184 361/679.6 |
| 5,745,345 | A | * | 4/1998 | Deguchi | G06K 7/0047 361/737 |
| 6,362,978 | B1 | * | 3/2002 | Boe | G06F 1/184 248/65 |
| 6,798,669 | B1 | * | 9/2004 | Hsu | G06F 1/184 361/726 |
| 7,330,358 | B2 | * | 2/2008 | Chen | H05K 7/142 361/752 |
| 7,467,963 | B2 | * | 12/2008 | Chen | H01R 13/631 439/327 |
| 7,535,731 | B2 | * | 5/2009 | Peng | G06F 1/184 361/801 |
| 7,876,569 | B2 | * | 1/2011 | Xue | G06F 1/184 361/732 |
| 8,517,744 | B2 | * | 8/2013 | Lin | H01R 12/73 439/533 |

(Continued)

*Primary Examiner* — Courtney L Smith
*Assistant Examiner* — Rashen E Morrison
(74) *Attorney, Agent, or Firm* — Womble Bond Dickinson (US) LLP (57) ABSTRACT

According to some embodiments, before an M.2 compatible module or device is mounted onto a data processing system that operates an autonomous driving vehicle (ADV), the M.2 module is placed onto a tray device to increase the stiffness of the M.2 module. The tray device containing the M.2 module is then mounted on a board or motherboard of the data processing system. Since the M.2 module is placed on the tray device, the overall stiffness has been significantly increased, which can sustain the physical impact on the M.2 module due to the physical movement and oscillation during the autonomous driving of the ADV. In addition, the tray device also provides suspension effect on the M.2 module during the movement of the ADV. As a result, the M.2 module would not easily damaged during the autonomous driving.

18 Claims, 9 Drawing Sheets

(56) References Cited

U.S. PATENT DOCUMENTS

| | | | | |
|---|---|---|---|---|
| 8,562,036 B2* | 10/2013 | Zhou | ................... | H01M 2/1061 |
| | | | | 292/256 |
| 8,929,088 B2* | 1/2015 | Ma | ...................... | H05K 7/1417 |
| | | | | 174/138 E |
| 9,207,709 B2* | 12/2015 | Xie | ........................... | G06F 1/16 |
| 9,703,331 B1* | 7/2017 | Chien | .................... | G06F 1/187 |
| 9,760,120 B2* | 9/2017 | Wu | ....................... | G06F 1/1637 |
| 9,778,708 B1* | 10/2017 | Meserth | .................. | G06F 1/185 |
| 9,854,673 B2* | 12/2017 | Yang | ....................... | G06F 1/185 |
| 9,933,822 B2* | 4/2018 | Tan | ...................... | H05K 5/0008 |
| 10,008,791 B1* | 6/2018 | Masumoto | .............. | F16B 35/06 |
| 2009/0185356 A1* | 7/2009 | Liao | ....................... | H05K 7/142 |
| | | | | 361/759 |
| 2011/0228462 A1* | 9/2011 | Dang | ................... | H05K 7/1429 |
| | | | | 361/679.4 |
| 2013/0058054 A1* | 3/2013 | Zhou | ....................... | G06F 1/185 |
| | | | | 361/748 |
| 2013/0216303 A1* | 8/2013 | Tang | .................... | H05K 7/1405 |
| | | | | 403/326 |
| 2013/0258629 A1* | 10/2013 | Fu | ........................... | G06F 1/185 |
| | | | | 361/785 |
| 2016/0066450 A1* | 3/2016 | Morita | ................. | H05K 5/0217 |
| | | | | 361/679.01 |
| 2016/0249455 A1* | 8/2016 | Yang | ....................... | G06F 1/185 |
| 2017/0322605 A1* | 11/2017 | Potter | .................... | G06F 1/187 |
| 2017/0371383 A1* | 12/2017 | Yang | ....................... | G06F 1/185 |

* cited by examiner

RETAINING TRAY FOR RETAINING AN M.2 COMPATIBLE DEVICE USED IN AUTONOMOUS DRIVING VEHICLES

FIELD OF THE INVENTION

Embodiments of the present invention relate generally to M.2 modules used in autonomous driving vehicles. More particularly, embodiments of the invention relate to a tray device to retain an M.2 module to be utilized in an autonomous driving vehicle.

BACKGROUND

Vehicles operating in an autonomous mode (e.g., driverless) can relieve occupants, especially the driver, from some driving-related responsibilities. When operating in an autonomous mode, the vehicle can navigate to various locations using onboard sensors, allowing the vehicle to travel with minimal human interaction or in some cases without any passengers.

Typically, an autonomous driving vehicle (ADV) is controlled by a data processing system that includes various functionalities to perceive a driving environment surrounding the ADV based on sensor data, plan a path to drive the ADV from one point to another point based on the perception information, and to control by issuing proper control commands based on the planning and control data obtained from a variety of sensors (e.g., LIDAR, RADAR, GPS, cameras). Due to the intense computation of the perception, planning, and controlling of autonomous driving, more and more processing resources such as processing and storage modules are deployed within the data processing system.

One of the popular modules deployed in an ADV is an M.2 compatible device or module. However, when an M.2 module is attached to a motherboard of the data processing system, due to the oscillation during the driving of the vehicle, the M.2 module is easily damaged. There has been a lack of efficient ways to reduce the probability of such damage.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

According to some embodiments, before an M.2 compatible module or device is mounted onto a data processing system that operates an ADV, the M.2 module is placed onto a tray device to increase the stiffness of the M.2 module. The tray device containing the M.2 module is then mounted on a board or motherboard of the data processing system. Since the M.2 module is placed on the tray device, the overall stiffness has been significantly increased, which can sustain the physical impact on the M.2 module due to the physical movement and oscillation or vibration during the autonomous driving of the ADV. In addition, the tray device also provides a suspension effect on the M.2 module during the movement of the ADV. As a result, the M.2 module would not be easily damaged during the autonomous driving.

According to one embodiment, a tray device for retaining an M.2 module includes a baseboard in a relatively rectangular shape, which includes a first and second longitudinal edges or sides and a first and second lateral edges or sides. The tray device further includes a first guardrail (also simply referred to as a guard or guard member) disposed on the top surface of the baseboard along the first longitudinal edge and a second guardrail disposed along the second longitudinal edge. The first and second guardrails are configured to keep the M.2 module in between and supported by the baseboard, while allowing the M.2 module to extend beyond or across the first and second lateral edges, for example, for mounting purposes. The tray device further includes a riser member disposed on the bottom surface of the baseboard (e.g., bottom of the tray device). When the M.2 module is mounted together with the tray device on a motherboard of a data processing system within an ADV, the riser member is configured to raise the tray device above and away from the motherboard to prevent the baseboard from applying a heavy pressure on an electronic component mounted on the motherboard underneath the tray device, for example, for saving space purpose.

In one embodiment, before mounting the M.2 module on the motherboard, the M.2 module is placed on the top surface of the baseboard and retained between the first and second guardrails. The M.2 module retained by the tray device is then mounted on the motherboard. As a result, the M.2 module would not be bent due to the physical movement or oscillation/vibration during the autonomous driving of the ADV. In addition, an adhesive strip is placed on the top surface of the baseboard. The adhesive strip is to create an attractive force to draw the M.2 module towards to the top surface of the baseboard. The adhesive strip is utilized to reduce the chances that the M.2 module moves around during the autonomous driving. Further, the adhesive strip may be in a form of a foam pad, which further provides suspension and softens the contacting impact between the M.2 module and the baseboard during the autonomous driving. Furthermore, another adhesive strip may be placed on the bottom of the riser member to reduce the chances that the tray device moves around on the motherboard. Alternatively, the riser member includes a threaded nut or a thread hole molded therein to allow a screw to be inserted from the bottom or opposite side of the motherboard to mount or attach the tray device onto the motherboard.

Figure 1:
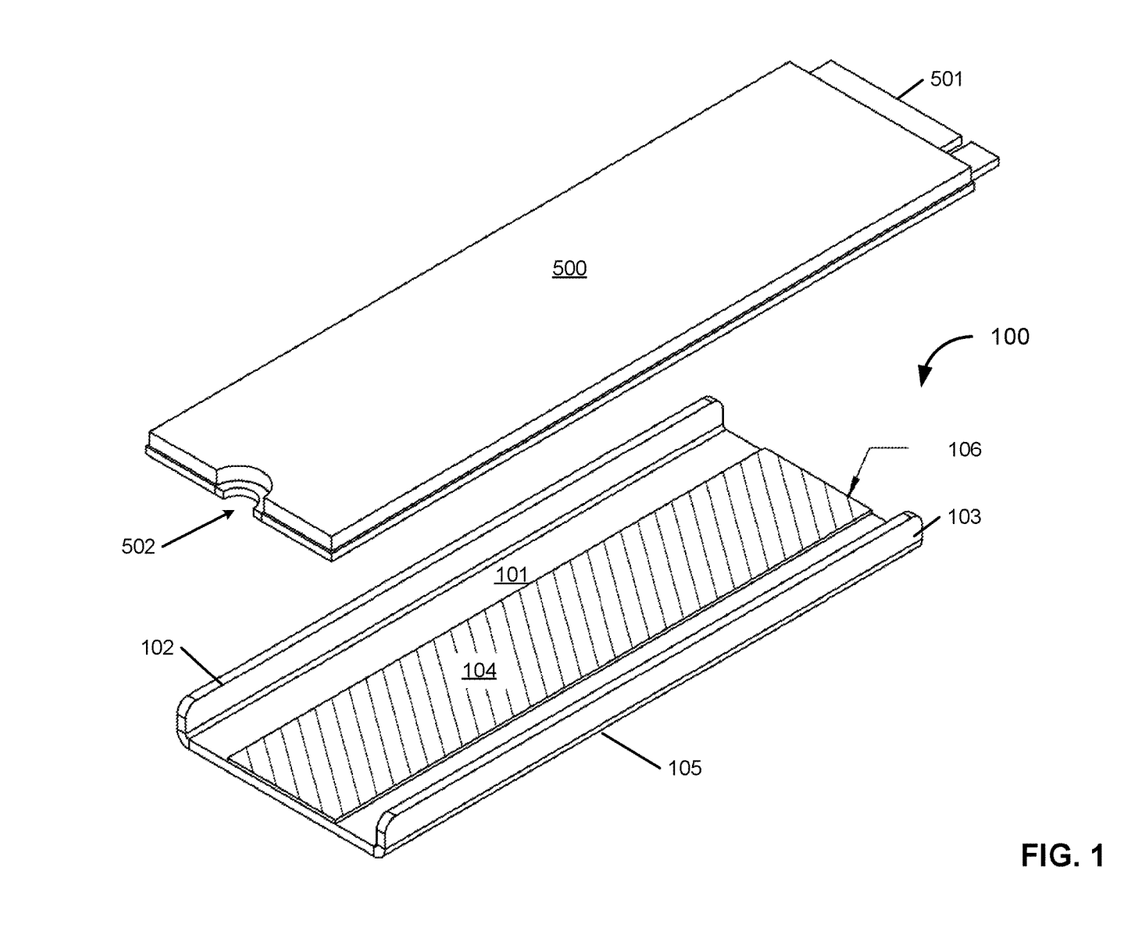
FIG. 1 shows a perspective view of a tray device for retaining an M.2 module according to one embodiment.

FIG. 1 shows a perspective view of a tray device for retaining an M.2 module according to one embodiment. Referring to FIG. 1, tray device 100 includes baseboard 101 in a relatively rectangular shape. Baseboard 101 includes a first longitudinal edge (also referred to as a longitudinal side) and a second longitudinal edge such as longitudinal edge 105, substantially in parallel to each other. Baseboard 101 further includes a first lateral edge (also referred to as a lateral side) and a second lateral edge such as lateral edge 106, substantially in parallel to each other.

A first guardrail 102 (also referred to as a retaining member) is disposed or attached to the first longitudinal edge of baseboard 101. A second guardrail 103 is disposed or attached to the second longitudinal edge of baseboard 101. First guardrail 102, second guardrail 103, and baseboard 101 form a U-shape tray to allow an M.2 module such as M.2 module 500 to be retained therein. Note that first guardrail 102, second guardrail 103, and baseboard 101 may be a single piece of material molded into a U-shape retainer tray. First guardrail 102 and second guardrail 103 are configured to retain and restrain M.2 module 500 within the tray device 100, while allowing the longitudinal ends of the M.2 module 500 extending across or beyond the lateral edges of baseboard 101 for the purpose of being mounted on the motherboard of the data processing system.

Figure 7A:
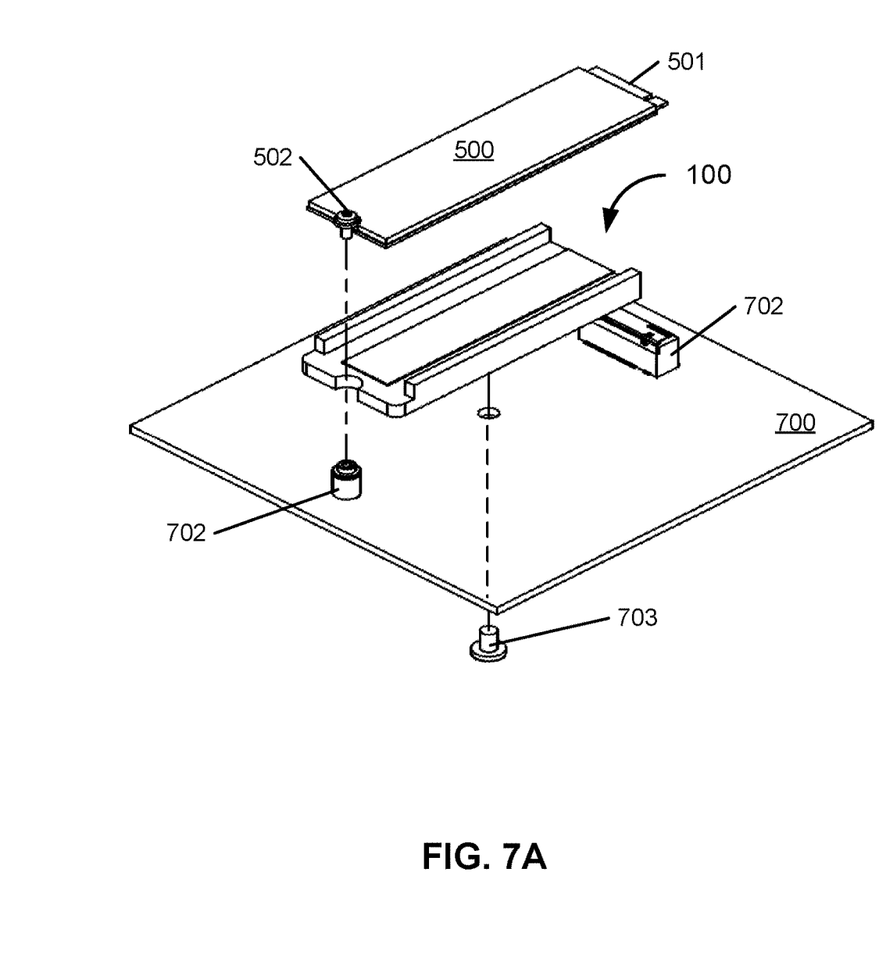
FIGS. 7A-7E show various views of a tray device for retaining an M.2 device according to alternative embodiments.

As shown in FIG. 1, M.2 module 500 includes a first longitudinal end 501 and a second longitudinal end 502. The first longitudinal end 501 includes on the printed circuit board (PCB) an array of electrically conductive pins or pads that can be inserted into an M.2 compatible socket (as shown in FIG. 7A) disposed on the motherboard of the data processing system (e.g., industrial personal computer or IPC) that is utilized to operate an autonomous driving vehicle. Second longitudinal end 502 includes a cutout or cavity that allow a screw to be inserted and screwed into a nut or bolt disposed on the motherboard of the data processing system, for example, as shown in FIG. 7A. As a result, M.2 module 500 can be securely mounted onto the motherboard.

M.2 is a specification for internally mounted computer expansion cards and associated connectors. It replaces the mSATA standard, which uses the PCI Express Mini Card physical card layout and connectors. M.2's more flexible physical specification allows different module widths and lengths, and, paired with the availability of more advanced interfacing features, makes the M.2 more suitable than mSATA for solid-state storage applications in general and particularly for the use in small devices such as ultrabooks or tablets.

M.2 modules are rectangular, with an edge connector on one side (75 positions with up to 67 pins, 0.5 mm pitch, pins overlap on different sides of the PCB), and a semicircular mounting hole at the center of the opposite edge. An M.2 module is installed into a mating connector provided by the host's circuit board, and a single mounting screw secures the module into place. Components may be mounted on either side of the module, with the actual module type limiting how thick the components can be; the maximum allowable thickness of components is 1.5 mm per side. Different host-side connectors are used for single- and double-sided M.2 modules, providing different amounts of space between the M.2 expansion card and the host's PCB. Circuit boards on the hosts are usually designed to accept multiple lengths of M.2 modules, which means that the sockets capable of accepting longer M.2 modules usually also accept shorter ones by providing different positions for the mounting screw.

An autonomous vehicle refers to a vehicle that can be configured to in an autonomous mode in which the vehicle navigates through an environment with little or no input from a driver. Such an autonomous vehicle can include a sensor system having one or more sensors that are configured to detect information about the environment in which the vehicle operates. The vehicle and its associated controller(s) use the detected information to navigate through the environment. An autonomous vehicle can operate in a manual mode, a full autonomous mode, or a partial autonomous mode.

However, referring back to FIG. 1, due to the relatively thinness of the PCB, M.2 module 500 can be easily damaged during the physical movement of the vehicle, especially due to the relative movement between the M.2 module 500 and the electronic components mounted on the motherboard beneath the M.2 module 500. In one embodiment, by placing M.2 module 500 onto tray device 100 before mounting M.2 module 500 onto motherboard, the stiffness of the M.2 module 500, because the try device 100 provides protection to M.2 module 500 and prevents M.2 module 500 from becoming bended.

According to one embodiment, an adhesive strip 104 is disposed on the top surface of baseboard 101. When M.2 module 500 is placed on the top of the adhesive strip 104, the adhesiveness of the adhesive strip 104 creates an attractive force to draw M.2 module 500 towards to the top surface of baseboard 101, which in turn prevent M.2 module 500 from moving around, for example, laterally with respect to the top surface of baseboard 101. In one embodiment, the adhesive strip 104 is implemented in an adhesive foam pad. Due to the softness of the foam pad, when M.2 module 500 is placed against the top surface of baseboard 101 and then mounted onto the motherboard, the foam pad creates a separation force between the M.2 module 500 and the top surface of the baseboard 101 that literally interlocks both baseboard 101 and M.2 module 500 together.

Figure 2:
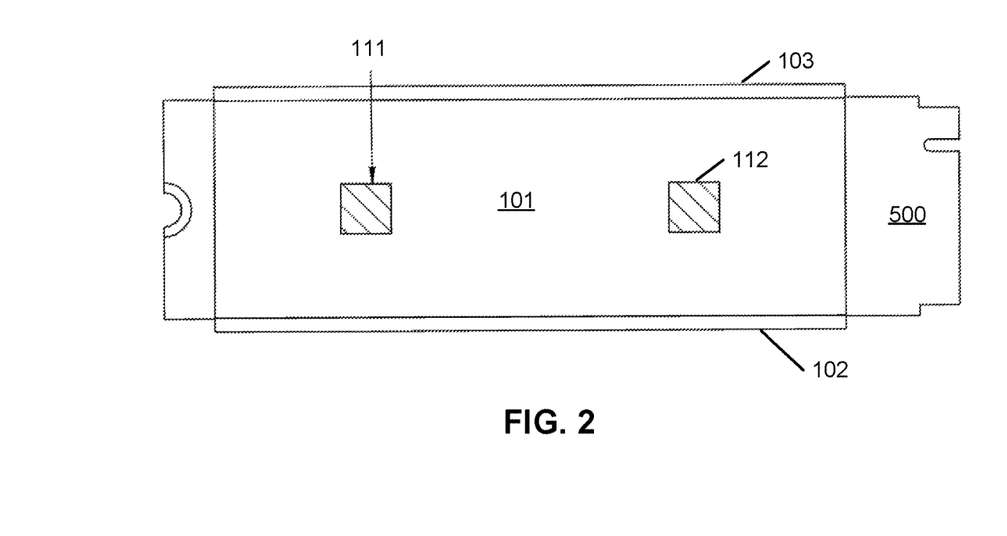
FIG. 2 shows a bottom view of a tray device for retaining an M.2 module according to one embodiment.
Figure 3:
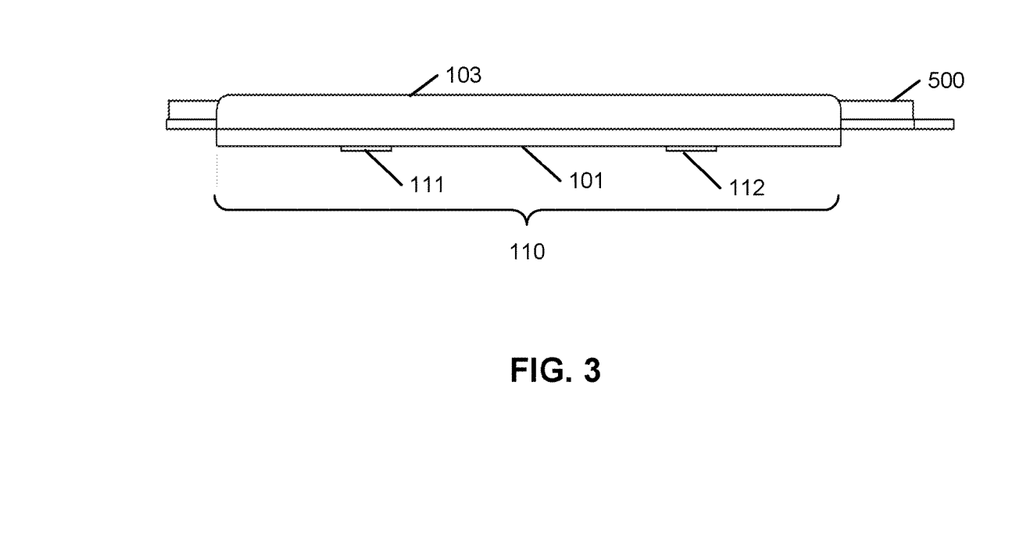
FIG. 3 shows a longitudinal side view of a tray device for retaining an M.2 module according to one embodiment.

FIG. 2 shows a bottom view and FIG. 3 shows a longitudinal side view of the tray device 100 and M.2 module 500 according to one embodiment. Referring to FIGS. 2 and 3, in one embodiment, a riser member is disposed on a bottom surface of baseboard 101. The riser member is configured to raise the level of baseboard (i.e., the entry tray device 100) above the motherboard when the M.2 module 500 together with tray device 100 is mounted on the motherboard, which in turn reduces the pressure significantly onto the electronic components disposed on the motherboard and underneath the tray device 100.

In this embodiment, a first riser member 111 is disposed closer to one end of the baseboard 101 while a second riser member 112 is disposed closer to the other end of the baseboard 101. With the riser member or members, the electronic components placed between the tray device 100 and the motherboard would not be pressed or crushed. In one embodiment, an adhesive layer is also attached to the bottom surface of riser members 111-112. The adhesive layer can reduce the chances of the tray device 100 moving around, for example, laterally with respect to the surface of the motherboard. Note that the riser members 111-112 are shown for the illustration purpose only. More or fewer number of riser members may be implemented, and their relative positions on the baseboard 101 can be different.

In one embodiment, a longitudinal dimension or length 110 of baseboard 101 (e.g., the length of the longitudinal edges 102-103) is ranging approximately from 63-69 millimeters (mm). In one particular embodiment, the length of baseboard 101 is approximately 63.5 mm. In another particular embodiment, the length of baseboard 101 is approximately 68.5 mm.

Figure 4:
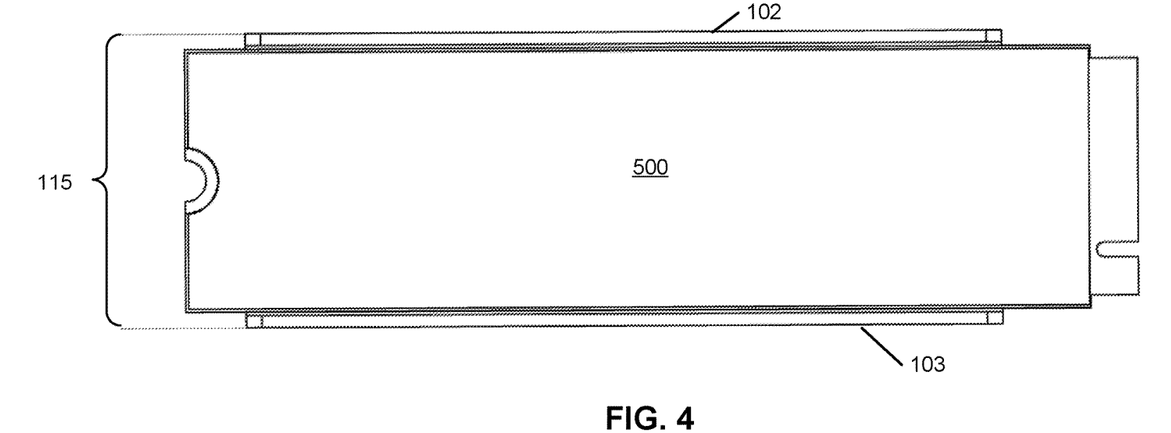
FIG. 4 shows a bottom view of a tray device for retaining an M.2 module according to one embodiment.
Figure 5:
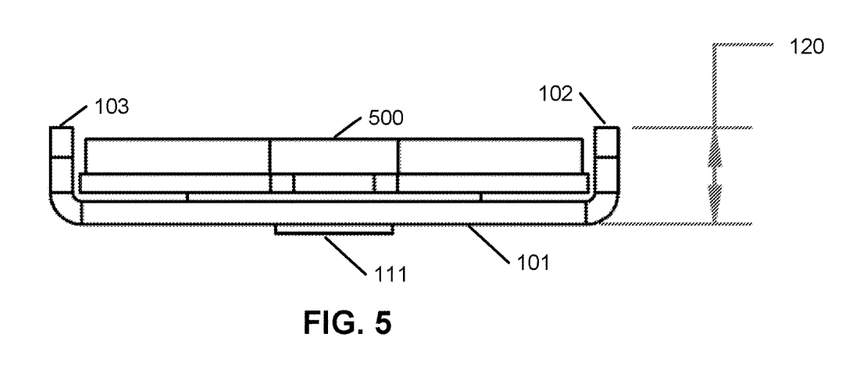
FIG. 5 shows a lateral side view of a tray device for retaining an M.2 module according to one embodiment.

FIG. 4 shows a top view and FIG. 5 shows a lateral side view of tray device 100 and M.2 module 500 according to one embodiment. In one embodiment, a lateral dimension or width 115 of tray device 100 is ranging approximately from 24 to 28 mm. In one particular embodiment, the width of tray device 100 is approximately 24.5 mm. In another particular embodiment, the width of tray device 100 is approximately 27.5 mm. In one embodiment, the height of tray device 100 is ranging approximately from 4 to 7 mm. In one particular embodiment, the height of tray device 100 is approximately 4.2 mm. In another particular embodiment, the height of tray device 100 is approximately 7.1 mm.

Figure 6A:
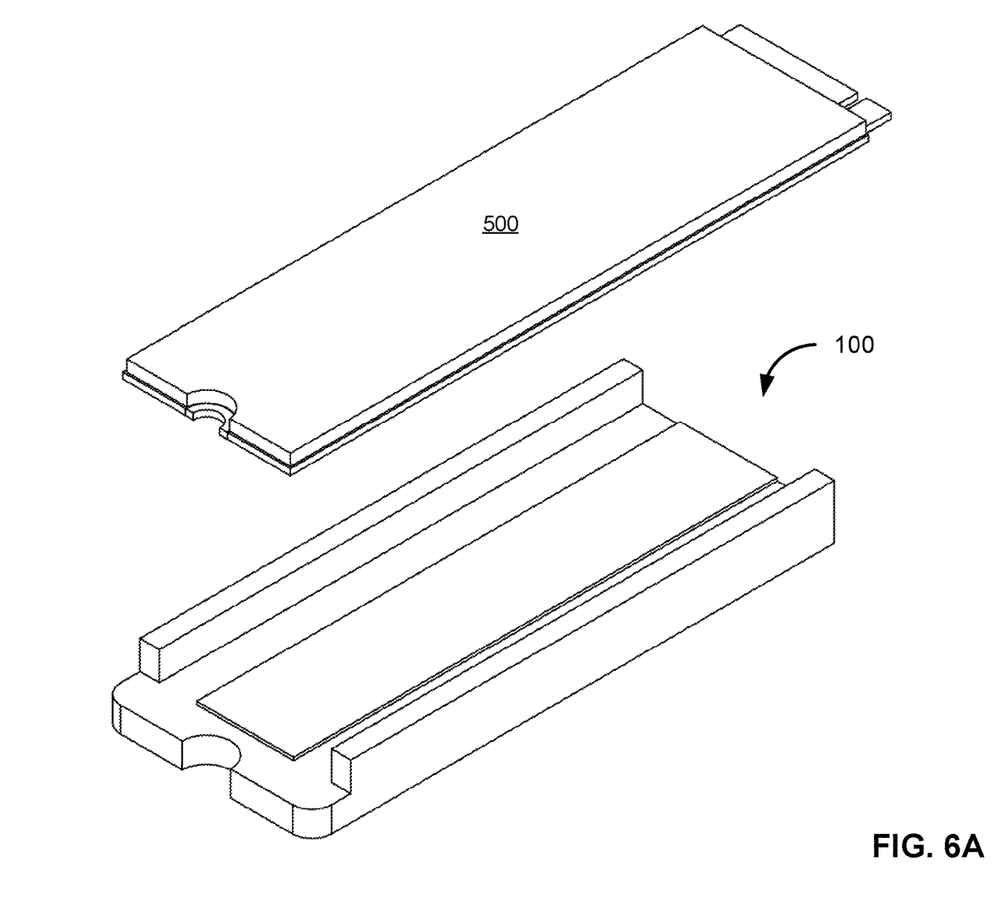
FIGS. 6A-6E show various views of a tray device for retaining an M.2 device according to alternative embodiments.
Figure 6B:
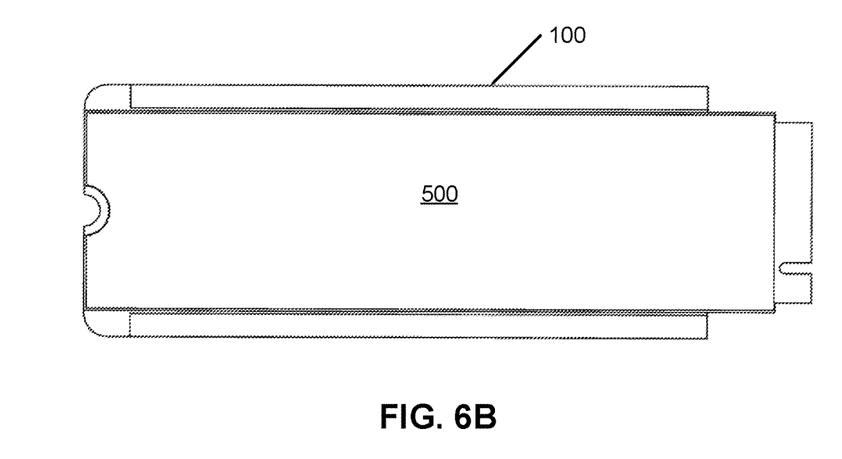
Figure 6C:
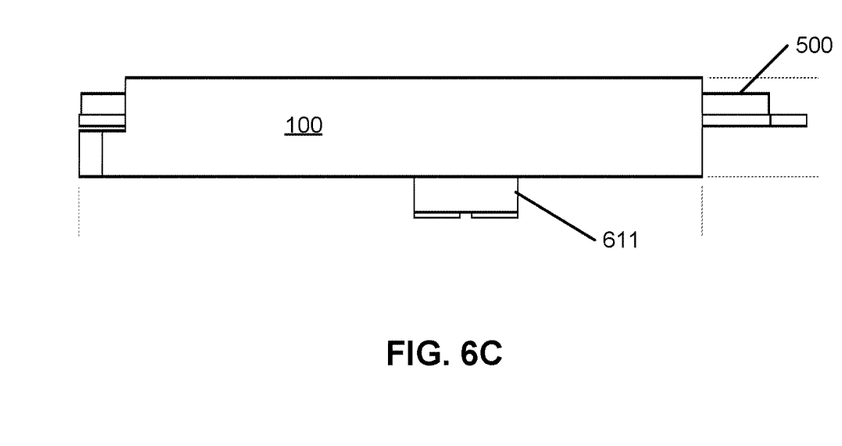
Figure 6D:
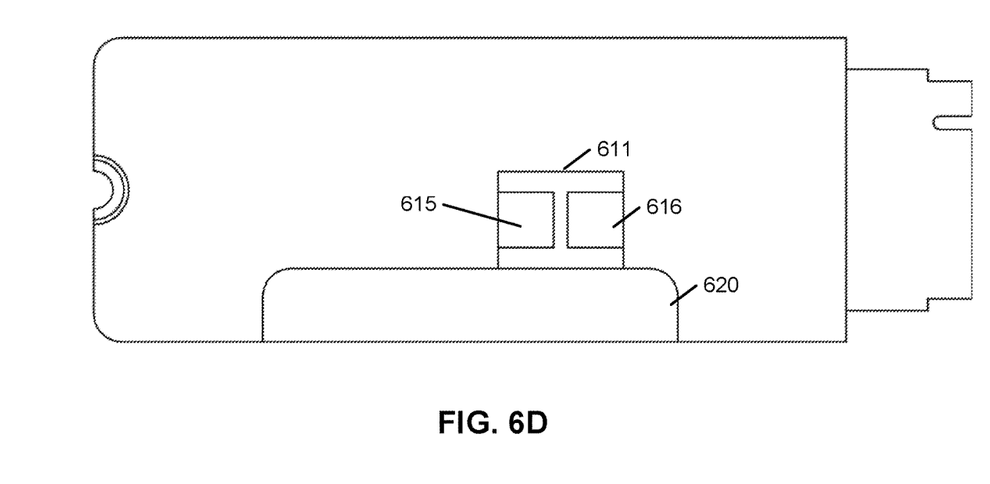
Figure 6E:
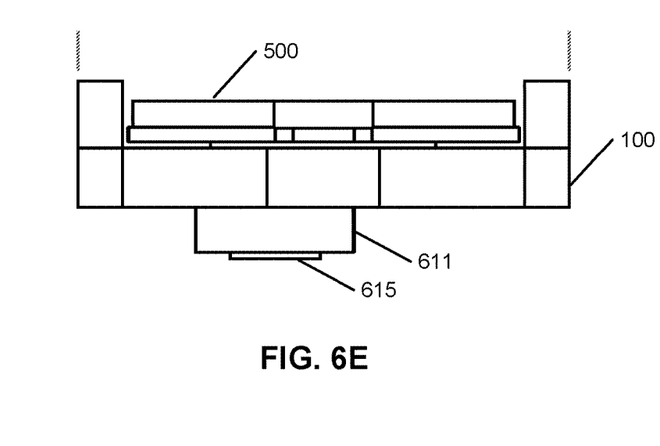

As described above, the specific configuration of tray device 100 as shown in FIGS. 1-5 is described for the purpose of illustration only. Other configurations such as FIGS. 6A-6E may also be implemented according to other embodiments. As shown in FIGS. 6C-6E, dependent upon the specific motherboard configuration, there may be a single riser member disposed at the bottom. The riser member may be disposed at any location on the bottom surface of baseboard 101. Referring to FIGS. 6D and 6E, which show a bottom view and a lateral side view, a single riser member 611 is implemented in this embodiment. In addition, the position of riser member 611 is not at the center of the baseboard. Such a configuration depends upon the available space on the motherboard. The size of single riser member 611 may be big enough to support the entire tray device, and located at a proper location within the bottom surface of the baseboard for balancing purpose. Multiple adhesive pads 615-616 may be disposed on the bottom of riser member 611. In addition, certain area such as area 620 at the bottom of the baseboard may be carved out to reserve more room for the electronic components on the motherboard underneath.

Figure 7B:
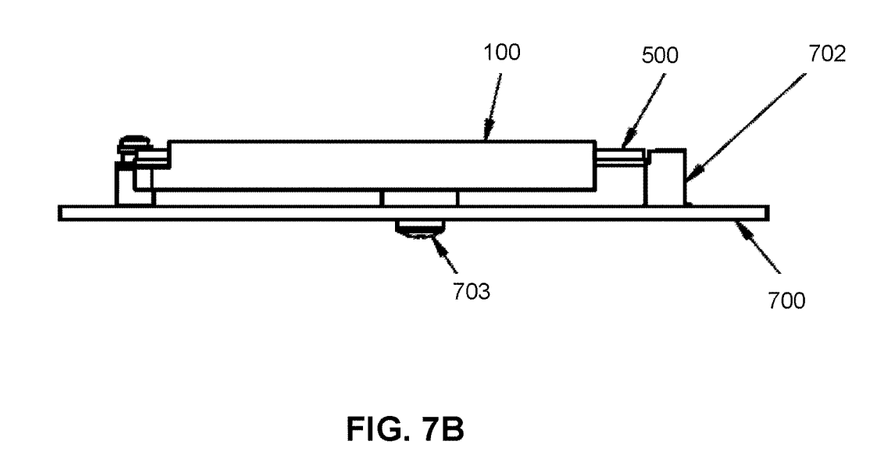
Figure 7C:
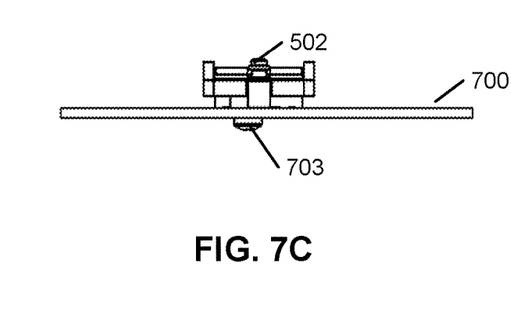
Figure 7D:
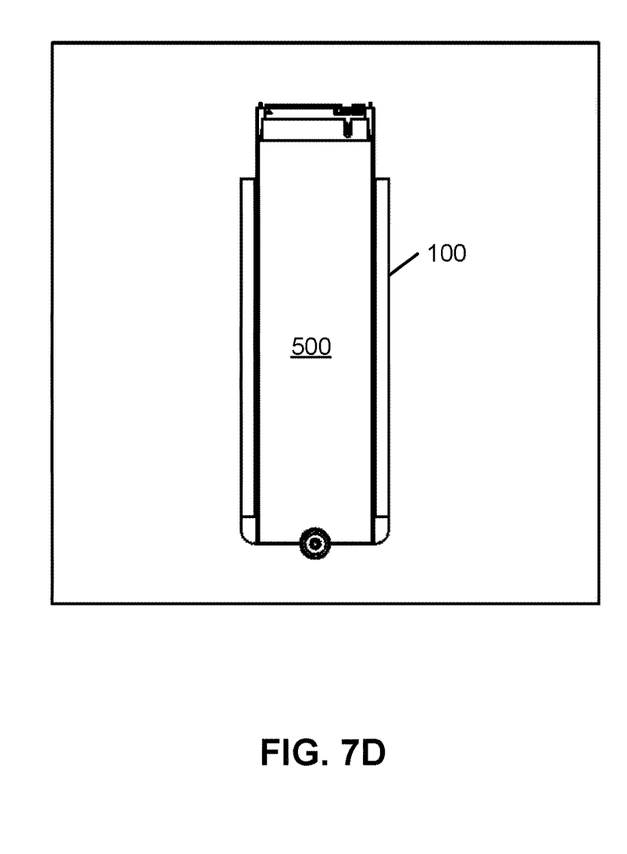
Figure 7E:
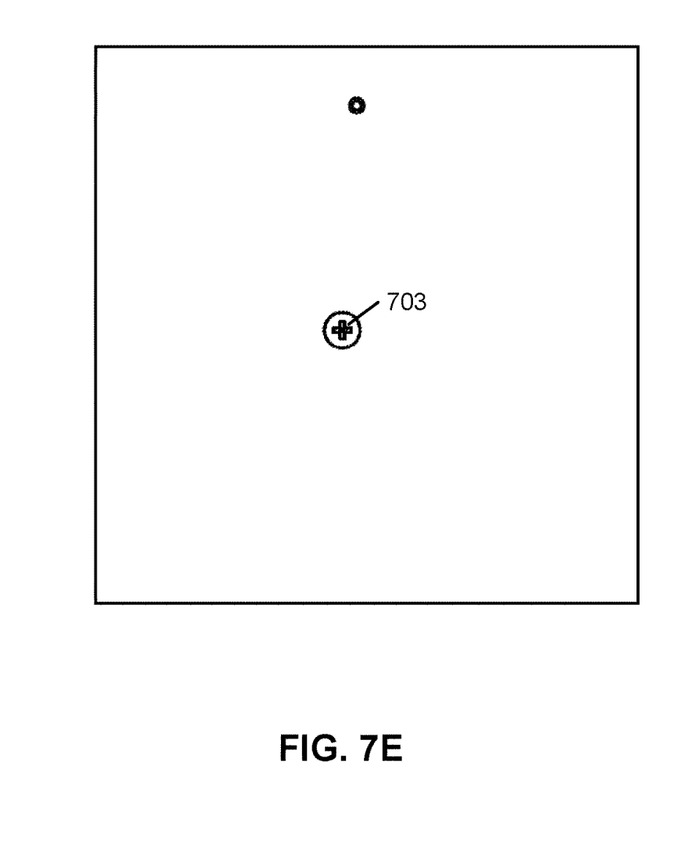

FIGS. 7A-7E show various views of a tray device for retaining an M.2 device according to another embodiment. Referring to FIG. 7A, which shows a perspective view, M.2 device 500 can be mounted to via a first end 502 using a screw screwing onto a threaded nut 701 disposed on motherboard 700, while the second end 501 can be inserted into an M.2 compatible socket 702. In addition, riser member 111 includes a threaded nut or threaded hole embedded therein to allow a screw 703 to be inserted from a bottom of motherboard 700 to mount tray device 100 onto motherboard as shown in FIG. 7B (longitudinal side view), FIG. 7C (lateral side view), FIG. 7D (top view), and FIG. 7E (bottom view).

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A tray device to retain an M.2 module used in an autonomous driving vehicle, the tray device comprising:
   a baseboard configured in a relatively rectangular shape having a first and second longitudinal edges and a first and second lateral edges;
   a first guardrail disposed on a top surface of the baseboard along the first longitudinal edge;
   a second guardrail disposed on the top surface of the baseboard along the second longitudinal edge, wherein the first and second guardrails are to keep an M.2 module in between and supported by the top surface of the baseboard, while allowing the M.2 module to extend beyond the first and second lateral edges; and
   a riser member disposed on a bottom surface of the baseboard, wherein when the M.2 module is mounted together with the tray device on a motherboard of a data processing system within an autonomous driving vehicle, the riser member is configured to raise the tray device above the motherboard to prevent the baseboard from applying a pressure that may adversely affect an electronic component mounted on the motherboard and underneath the tray device.

2. The tray device of claim 1, wherein the M.2 module is placed on the top surface of the baseboard between the first guardrail and the second guardrail, before being mounted together with the baseboard on the motherboard of the data processing system.

3. The tray device of claim 2, wherein the baseboard increases the stiffness of the M.2 module such that the M.2 module will not bend due to oscillation of autonomous driving of the autonomous driving vehicle.

4. The tray device of claim 1, further comprising an adhesive strip disposed on the top surface of the baseboard, wherein the adhesive strip is to create an attractive force to draw the M.2 module towards to the top surface of the baseboard.

5. The tray device of claim 4, wherein the adhesive strip is configured in a foam pad to provide additional suspension effect to the M.2 module.

6. The tray device of claim 1, wherein the riser member further includes an adhesive strip disposed on a bottom surface of the riser member, such that the adhesive strip creates an attractive force to draw the tray device towards to the top surface of the motherboard.

7. The tray device of claim 1, wherein the riser member comprises a first riser member disposed closer to a first end of the baseboard and a second riser member disposed closer to a second end of the baseboard.

8. The tray device of claim 1, wherein a length of each of the first and second longitudinal edges of the baseboard is ranging approximately 63 to 69 millimeters (mm).

9. The tray device of claim 1, wherein a length of each of the first and second longitudinal edges of the baseboard is approximately 63.5 mm.

10. The tray device of claim 1, wherein a length of each of the first and second longitudinal edges of the baseboard is approximately 68.5 mm.

11. The tray device of claim 1, wherein a width of each of the first and second lateral edges of the baseboard is ranging approximately 24 to 28 mm.

12. The tray device of claim 1, wherein a width of each of the first and second lateral edges of the baseboard is approximately 24.5 mm.

13. The tray device of claim 1, wherein a width of each of the first and second lateral edges of the baseboard is approximately 27.5 mm.

14. The tray device of claim 1, wherein a height of the tray device is ranging approximately from 4 to 7 mm.

15. The tray device of claim 1, wherein a height of the tray device is approximately from 4.2 mm.

16. The tray device of claim 1, wherein a height of the tray device is approximately from 7.1 mm.

17. The tray device of claim 1, wherein the riser further includes a threaded nut embedded therein to allow a screw to be inserted from a bottom of the motherboard to mount the tray device onto the motherboard of the data processing system.

18. The tray device of claim 1, wherein the riser is molded to include a threaded hole embedded therein to allow a screw to be inserted from a bottom of the motherboard to mount the tray device onto the motherboard of the data processing system.

* * * * *